United States Patent
Iwata et al.

(10) Patent No.: US 10,844,243 B2
(45) Date of Patent: *Nov. 24, 2020

(54) POLISHING COMPOSITION FOR MAGNETIC DISK SUBSTRATE

(71) Applicant: YAMAGUCHI SEIKEN KOGYO CO., LTD., Aichi (JP)

(72) Inventors: Toru Iwata, Aichi (JP); Akina Ban, Aichi (JP); Yuka Ishida, Aichi (JP)

(73) Assignee: YAMAGUCHI SEIKEN KOGYO CO., LTD. (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/026,902

(22) Filed: Jul. 3, 2018

(65) Prior Publication Data

US 2019/0010358 A1 Jan. 10, 2019

(30) Foreign Application Priority Data

Jul. 4, 2017 (JP) ................. 2017-131259

(51) Int. Cl.
| | |
|---|---|
| *C09G 1/02* | (2006.01) |
| *C09K 3/14* | (2006.01) |
| *C09K 13/00* | (2006.01) |
| *C09K 13/06* | (2006.01) |
| *H01L 21/306* | (2006.01) |
| *H01L 21/321* | (2006.01) |

(52) U.S. Cl.
CPC .............. *C09G 1/02* (2013.01); *C09K 3/1409* (2013.01); *C09K 3/1463* (2013.01); *C09K 13/00* (2013.01); *C09K 13/06* (2013.01); *H01L 21/30625* (2013.01); *H01L 21/3212* (2013.01)

(58) Field of Classification Search
CPC . C09G 1/02; H01L 21/30625; H01L 21/3212; C09K 13/00; C09K 13/06; C09K 3/1463; C09K 3/1409
See application file for complete search history.

(56) References Cited

U.S. PATENT DOCUMENTS

| | | | |
|---|---|---|---|
| 6,261,476 B1 | 7/2001 | Kwok et al. | |
| 9,856,401 B2* | 1/2018 | Iwata | .................... C09K 3/1409 |
| 2002/0028632 A1* | 3/2002 | Shimamoto | .............. C09G 1/02 |
| | | | 451/36 |
| 2009/0111359 A1 | 4/2009 | Suzuki et al. | |
| 2010/0009537 A1 | 1/2010 | Balasubramaniam et al. | |
| 2011/0203186 A1 | 8/2011 | Oshima et al. | |
| 2012/0045974 A1 | 2/2012 | Nakanishi et al. | |
| 2014/0335763 A1* | 11/2014 | Oshima | ................. B24B 37/044 |
| | | | 451/36 |
| 2017/0015867 A1* | 1/2017 | Iwata | .................... C09K 3/1409 |

FOREIGN PATENT DOCUMENTS

| | | |
|---|---|---|
| JP | 2001260005 A | 9/2001 |
| JP | 2009176397 A | 8/2009 |
| JP | 2010167553 A | 8/2010 |
| JP | 2011204327 A | 10/2011 |
| JP | 2011527643 A | 11/2011 |
| JP | 2012043493 A | 3/2012 |
| JP | 2012155785 A | 8/2012 |
| JP | 2014029754 A | 2/2014 |
| JP | 2014029755 A | 2/2014 |

* cited by examiner

*Primary Examiner* — Duy Vu N Deo
(74) *Attorney, Agent, or Firm* — Bracewell LLP; Brad Y. Chin

(57) ABSTRACT

Embodiments relate to a polishing composition including colloidal silica, pulverized wet-process silica particles, and at least one of a nitrogen-containing organic compound and a nitrogen-containing polymer compound. According to another embodiment, the polishing composition includes colloidal silica, pulverized wet-process silica particles, and a copolymer containing a monomer having a carboxylic acid group and a monomer having a sulfonic acid group as essential monomers. According to another embodiment, the polishing composition includes colloidal silica, pulverized wet-process silica particles, a nitrogen-containing organic compound and/or a nitrogen-containing polymer compound, and a copolymer containing a monomer having a carboxylic acid group and a monomer having a sulfonic acid group as essential monomers.

13 Claims, No Drawings

POLISHING COMPOSITION FOR MAGNETIC DISK SUBSTRATE

CROSS REFERENCE TO RELATED APPLICATIONS

This application claims the benefit of and priority to Japanese Patent Application No. JP-2017-131259, filed on Jul. 4, 2017, with Japanese Patent Office, the entire contents of which are incorporated herein by reference.

BACKGROUND

Field

Embodiments relate to a polishing composition used for polishing electronic components, such as semiconductors and magnetic recording media including hard disks. Particularly, embodiments relate to a polishing composition used for polishing a surface of a substrate for a magnetic recording medium, such as a glass magnetic disk substrate or an aluminum magnetic disk substrate. Further, embodiments relate to a polishing composition used for polishing a surface of an aluminum magnetic disk substrate for a magnetic recording medium, having an electroless nickel-phosphorus plated film formed on a surface of an aluminum alloy substrate.

Description of the Related Art

Conventionally, as a polishing composition for polishing an electroless nickel-phosphorous plated film surface of an aluminum magnetic disk substrate, a polishing composition obtained by dispersing alumina particles having a relatively large particle size capable of realizing a high polishing rate in water has been used from a viewpoint of productivity. However, in a case of using alumina particles, the alumina particles have a considerably higher hardness than the electroless nickel-phosphorus plated film of the aluminum magnetic disk substrate. Therefore, alumina particles are embedded in the substrate, and the embedded particles have a bad influence on a subsequent polishing step and washing step disadvantageously. Further, the surface quality of the substrate is deteriorated, and the response thereto has been a factor to lower productivity.

As solutions to this problem, polishing compositions have been proposed in which alumina particles and silica particles are combined (for example, Patent Documents 1 to 4). There have also been proposed methods in which polishing is performed, with no use of alumina particles, using only silica particles (Patent Documents 5 to 9).

CITATION LIST

[Patent Document 1] JP-A-2001-260005
[Patent Document 2] JP-A-2009-176397
[Patent Document 3] JP-A-2011-204327
[Patent Document 4] JP-A-2012-43493
[Patent Document 5] JP-A-2010-167553
[Patent Document 6] JP-A-2011-527643
[Patent Document 7] JP-A-2014-29754
[Patent Document 8] JP-A-2014-29755
[Patent Document 9] JP-A-2012-155785

SUMMARY

As described in Patent Documents 1 to 4, it is possible that by combining alumina particles and silica particles, the alumina particles that are embedded in the substrate are removed to some degree. However, as long as a polishing composition including alumina particles is used, there still remains the possibility that the alumina particles contained in the polishing composition are embedded in the substrate. In addition, since the proposed polishing compositions include both alumina particles and silica particles, there is caused a problem that the respective properties possessed by the alumina particles and by the silica particles are negated with each other, leading to worsening of the polishing rate and surface smoothness.

Therefore, there have been proposed methods in which polishing is performed, with no use of alumina particles, using only silica particles. In Patent Documents 5 and 6, there are proposed to combine colloidal silica and a polishing accelerator. In Patent Documents 7 and 8, there are proposed methods in which polishing is performed using colloidal silica, as well as fumed silica, surface modified silica, silica produced in water glass process, and other types of silica, in particular colloidal silica having particular shapes. However, these methods do not achieve a sufficient polishing rate, and are required to make improvements.

In addition, in Patent Document 9, there is proposed a method in which crushed silica particles are used, thereby to obtain a polishing rate close to that obtained when alumina particles are used. However, this method has a problem of worsening the surface smoothness, and is required to make improvements.

Various embodiments of the subject application have been made in light of problems caused by these conventional techniques, and have an object to provide a polishing composition reducing loads of a polishing process and a washing process in the subsequent stage (after rough polishing), and contributing to improving productivity, by realizing good surface smoothness and good washability, while maintaining a polishing rate, without using alumina particles.

According to at least one embodiment, colloidal silica having a particular particle size, pulverized wet-process silica particles having a particular particle size, and at least one of a nitrogen-containing organic compound and a nitrogen-containing polymer compound are combined, thereby achieving good surface smoothness and good washability, while maintaining a polishing rate, and contributing to improving productivity of the process in the subsequent stage.

According to at least one embodiment, colloidal silica having a particular particle size, pulverized wet-process silica particles having a particular particle size, and a copolymer containing a monomer having a carboxylic acid group and a monomer having a sulfonic acid group as essential monomers are combined, thereby achieving good surface smoothness and good washability, while maintaining a polishing rate, and contributing to improving productivity of the process in the subsequent stage.

According to at least one embodiment, colloidal silica having a particular particle size, pulverized wet-process silica particles having a particular particle size, at least one of a nitrogen-containing organic compound and a nitrogen-containing polymer compound, and a copolymer containing a monomer having a carboxylic acid group and a monomer having a sulfonic acid group as essential monomers are combined, thereby achieving good surface smoothness and very good washability, while maintaining a polishing rate, and contributing to improving productivity of the process in the subsequent stage. Thus, according to various embodiments, a polishing composition as described below is provided.

According to at least one embodiment, there is provided a polishing composition for a magnetic disk substrate, including: colloidal silica having an average primary particle size of 5 to 200 nm; pulverized wet-process silica particles having an average particle size of 100 to 1000 nm; at least one of a nitrogen-containing organic compound and a nitrogen-containing polymer compound; and water, where the colloidal silica accounts for 5 to 95 mass %, and the pulverized wet-process silica particles account for 5 to 95 mass %, of total silica particles, and a concentration of the total silica particles is 1 to 50 mass %.

According to at least one embodiment, there is provided a polishing composition for a magnetic disk substrate, including: colloidal silica having an average primary particle size of 5 to 200 nm; pulverized wet-process silica particles having an average particle size of 100 to 1000 nm; a copolymer containing a monomer having a carboxylic acid group and a monomer having a sulfonic acid group as essential monomers; and water, where the colloidal silica accounts for 5 to 95 mass %, and a the pulverized wet-process silica particles account for 5 to 95 mass %, of total silica particles, and a concentration of the total silica particles is 1 to 50 mass %.

According to at least one embodiment, there is provided a polishing composition for a magnetic disk substrate, including: colloidal silica having an average primary particle size of 5 to 200 nm; pulverized wet-process silica particles having an average particle size of 100 to 1000 nm; at least one of a nitrogen-containing organic compound and a nitrogen-containing polymer compound; and a copolymer containing a monomer having a carboxylic acid group and a monomer having a sulfonic acid group as essential monomers; and water; where the colloidal silica accounts for 5 to 95 mass %, and the pulverized wet-process silica particles account for 5 to 95 mass %, of total silica particles, and a concentration of the total silica particles is 1 to 50 mass %.

According to at least one embodiment, the nitrogen-containing organic compound is at least one of a polyalkylene polyamine and a quaternary ammonium salt.

According to at least one embodiment, the nitrogen-containing polymer compound is a cationic nitrogen-containing polymer compound, including a polymer or copolymer containing a monomer having a quaternary ammonium salt group as an essential monomer.

According to at least one embodiment, the nitrogen-containing polymer compound has a weight average molecular weight of 500 to 1,000,000, and a concentration of 0.00001 to 1.0 mass % in the polishing composition.

According to at least one embodiment, the copolymer containing a monomer having a carboxylic acid group and a monomer having a sulfonic acid group as essential monomers is a copolymer having a quantity ratio of a structural unit derived from the monomer having a carboxylic acid group and a structural unit derived from the monomer having a sulfonic acid group being in a range of 95:5 to 5:95 by a mole ratio.

According to at least one embodiment, the polishing composition further includes a copolymer containing a monomer having a carboxylic acid group and a monomer having an amide group as essential monomers.

According to at least one embodiment, the copolymer containing a monomer having a carboxylic acid group and a monomer having an amide group as essential monomers is a copolymer having a quantity ratio of a structural unit derived from the monomer having a carboxylic acid group and a structural unit derived from the monomer having an amide group being in a range of 95:5 to 5:95 by a mole ratio.

According to at least one embodiment, the copolymer containing a monomer having a carboxylic acid group and a monomer having an amide group as essential monomers has a weight average molecular weight of 1,000 to 1,000,000, and a concentration of 0.0001 to 2.0 mass % in the polishing composition.

According to at least one embodiment, the polishing composition further includes an acid, wherein the polishing composition has a pH value (25° C.) in a range of 0.1 to 4.0.

According to at least one embodiment, the polishing composition further includes an oxidizing agent.

According to at least one embodiment, the polishing composition is used for polishing an aluminum magnetic disk substrate that is plated with electroless nickel-phosphorus.

The polishing composition for a magnetic disk substrate according to various embodiments is [1] a combination of colloidal silica, pulverized wet-process silica particles, and at least one of a nitrogen-containing organic compound and a nitrogen-containing polymer compound, [2] a combination of colloidal silica, pulverized wet-process silica particles, and a copolymer containing a monomer having a carboxylic acid group and a monomer having a sulfonic acid group as essential monomers, and [3] a combination of colloidal silica, pulverized wet-process silica particles, a nitrogen-containing organic compound and/or a nitrogen-containing polymer compound, and a copolymer containing a monomer having a carboxylic acid group and a monomer having a sulfonic acid group as essential monomers. Any polishing composition of these combinations achieves good surface smoothness and good washability while maintaining a polishing rate, and contributes to improving productivity in the subsequent process, when polishing the surface of an aluminum magnetic disk substrate for magnetic recording media having an electroless nickel-phosphorus plated film surface of a substrate of an aluminum alloy.

DETAILED DESCRIPTION

Embodiments of the present invention will be described below, but the present invention is not limited to the embodiments described below, and it should be understood that the scope of the present invention includes various embodiments in which the embodiments described below are modified, improved, or changed as appropriate, based on the ordinary knowledge of those skilled in the art, within the scope not deviating from the spirit of the present invention.

1. Polishing Composition

The polishing composition according to at least one embodiment is an aqueous composition containing colloidal silica, pulverized wet-process silica particles, and at least one of a nitrogen-containing organic compound and a nitrogen-containing polymer compound.

According to another embodiment, the polishing composition is an aqueous composition containing colloidal silica, pulverized wet-process silica particles, and a copolymer containing a monomer having a carboxylic acid group and a monomer having a sulfonic acid group as essential monomers.

According to another embodiment, the polishing composition is an aqueous composition containing colloidal silica, pulverized wet-process silica particles, a nitrogen-containing organic compound and/or a nitrogen-containing polymer compound, and a copolymer containing a monomer having a carboxylic acid group and a monomer having a sulfonic acid group as essential monomers.

According to at least one embodiment, the colloidal silica has an average primary particle size of 5-200 nm, and the pulverized wet-process silica particles have an average particle size of 100-1000 nm. Here, the wet-process silica particles are pulverized by pulverization in a manufacturing process thereof. That is, the process for manufacturing wet-process silica particles includes a pulverization step.

Hereinafter, the polishing composition according to various embodiments will be described in more detail. In the following description, when there is described simply as a "polishing composition," it refers to a polishing composition according to various embodiments, unless otherwise specified. Also in the following description, when there is described simply as "colloidal silica" or "wet-process silica particles," it refers to colloidal silica or wet-process silica particles for use in the according to various embodiments, respectively, unless otherwise specified. As the silica used in the according to various embodiments, in addition to the colloidal silica and the wet-process silica particles as essential components, fumed silica can be used as an optional component.

1-1. Colloidal Silica

The colloidal silica that is contained in a polishing composition according to at least one embodiment has an average primary particle size of 5 to 200 nm. Average primary particle sizes equal to or above 5 nm make it possible to prevent the polishing rate from decreasing. Average primary particle sizes of colloidal silica equal to or below 200 nm make it possible to prevent the surface smoothness after polishing from worsening. The average primary particle size of colloidal silica is preferably 10 to 150 nm, more preferably 30 to 100 nm.

According to at least one embodiment, colloidal silica is known in various shapes, for example, in spherical, kompeito-typed (like particles having convexes on the surface), heteromorphic, and other shapes, and forms colloid in which primary silica particles are monodispersed in water. The colloidal silica for use in the present invention particularly preferably is of a spherical or approximately spherical shape. The use of colloidal silica that is of a spherical or approximately spherical shape allows a further improvement in the surface smoothness. Colloidal silica is manufactured by water glass process in which sodium or potassium silicates are used as a raw material, and by an alkoxysilane method in which an alkoxysilane such as tetraethoxysilane is hydrolyzed with an acid or with an alkali.

1-2. Wet-Process Silica Particles

According to various embodiments, the wet-process silica particles refer to particles prepared from wet-process silica obtainable as precipitated silicic acid by adding an aqueous alkali silicate solution and an inorganic acid or an aqueous solution of an inorganic acid into a reaction vessel, by a pulverization process, and do not include the colloidal silica described above.

According to at least one embodiment, the aqueous alkali silicate solution that is used as a raw material for wet-process silica is an aqueous sodium silicate solution, an aqueous potassium silicate solution, an aqueous lithium silicate solution, and others. In general, an aqueous sodium silicate solution is preferably used. The inorganic acid can be sulfuric acid, hydrochloric acid, nitric acid, and others. In general, sulfuric acid is preferably used. After the completion of the reaction, the reaction solution is filtered, and washed with water and then dried in a dryer so as to have a water content of 6% or lower. The dryer can be any of a stationary dryer, a spray dryer, and a fluidized dryer. Thereafter, the dried material is pulverized in a pulverizer such as a jet mill, followed by classification to obtain wet-process silica particles. The wet-process silica particles having been pulverized by pulverization in this way have a corner portion and have a higher degree of polishing ability than that of approximately spherical particles.

According to at least one embodiment, the wet-process silica particles have an average particle size of preferably 100 to 1000 nm, more preferably 200 to 800 nm, still more preferably 200 to 600 nm. The average particle size equal to or above 100 nm makes it possible to prevent the polishing rate from decreasing. The average particle size equal to or below 1000 nm makes it possible to prevent the surface smoothness after polishing from worsening.

1-3. Fumed Silica

According to at least one embodiment, the fumed silica used as an optional component is obtained by hydrolyzing a volatile silane compound (generally using silicon tetrachloride) in the flame of mixed gas of oxygen and hydrogen (at about 1000° C.), and is very fine, and high purity silica particles. Compared with the colloidal silica, the colloidal silica is present as primary particles dispersed individually, whereas the fumed silica is formed as secondary particles in which a many primary particles is aggregated and connected in a chain shape. By forming these secondary particles, retention force to a polishing pad is increased, thereby improving a polishing rate.

According to at least one embodiment, the fumed silica usually has an average particle size of 30 to 800 nm. The average particle size is preferably 60 to 600 nm, more preferably 80 to 400 nm. The average particle size equal to or above 30 nm makes it possible to prevent the polishing rate from decreasing. The average particle size equal to or below 800 nm makes it possible to prevent the surface smoothness after polishing from worsening.

Further, in the technology disclosed herein, an average particle size of the fumed silica refers to, unless particularly stated, a volume-based average particle size (D50) based on a dynamic light scattering method. The average particle size of the fumed silica refers to, regardless of whether the particle is a primary particle or a secondary particle, the average particle size of the particles dispersed in the polishing composition.

According to at least one embodiment, the colloidal silica accounts for 5 to 95 mass %, preferably 10 to 80 mass %, more preferably 10 to 70 mass %, of the total silica particles. The wet-process silica particles account for 5 to 95 mass %, preferably 10 to 80 mass %, more preferably 10 to 70 mass %, of the total silica particles.

The concentration of the total silica particles is 1 to 50 mass %, preferably 2 to 40 mass %, in the whole polishing composition. The concentrations of the total silica particles equal to or above 1 mass % make it possible to prevent the polishing rate from decreasing. The concentrations of the total silica particles equal to or below 50 mass % make it possible to retain a sufficient polishing rate without using excessive silica particles.

1-4. Nitrogen-Containing Organic Compound

The nitrogen-containing organic compound used in various embodiments is at least one compound selected from the group consisting of aliphatic alkanolamine, cyclic amine, polyalkylene polyamine and quaternary ammonium salt, or a mixture thereof.

The aliphatic alkanolamine may include monoethanol amine, diethanol amine, triethanol amine, dimethyl aminoethanol, diethyl aminoethanol, mono-n-propanol amine, di-n-propanol amine, tri-n-propanol amine and the like.

The cyclic amine may include piperidine, piperazine, 1,4-diazabicyclo (2,2,2) octane and the like.

The polyalkylene polyamine may include diethylene triamine, triethylene tetramine, tetraetehylene pentamine, pentaethylene hexamine and the like.

The quaternary ammonium salt may include lauryltrimethyl ammonium chloride, stearyltrimethyl ammonium chloride, distearyldimethyl ammonium chloride, lauryl dimethyl benzyl ammonium chloride, stearyl dimethyl benzyl ammonium chloride and the like. Among them, the polyalkylene polyamine and the quaternary ammonium salt are preferred.

The concentration of the nitrogen-containing organic compound in the polishing composition is generally 0.00001 to 1.0 mass %, more preferably 0.00005 to 0.5 mass %, still more preferably 0.0001 to 0.3 mass %.

1-5. Nitrogen-Containing Polymer Compound

The nitrogen-containing polymer compound used in various embodiments is preferably a cationic nitrogen-containing polymer compound, and may include for example, a polymer or copolymer containing a monomer having a quaternary ammonium salt group as an essential monomer. Still more preferably, a polymer or copolymer containing a diallyl dialkyl ammonium salt as an essential monomer may be included. Specifically, a polymer or copolymer containing diallyl dimethyl ammonium chloride or diallyl diethyl ammonium chloride as an essential monomer may be included. More specifically, polydiallyl dimethyl ammonium chloride, polydiallyl diethyl ammonium chloride, a diallyl dimethyl ammonium chloride-sulfur dioxide copolymer, a diallyl diethyl ammonium chloride-sulfur dioxide copolymer, a diallyl dimethyl ammonium chloride-acryl amide copolymer, a diallyl diethyl ammonium chloride-acryl amide copolymer, and the like may be included.

The nitrogen-containing polymer compound has a weight average molecular weight of usually 500 to 1,000,000, preferably 1,000 to 500,000. Further, the weight average molecular weight of the nitrogen-containing polymer compound particles is measured by gel permeation chromatography (GPC) in terms of polyethylene glycol.

The concentration of the nitrogen-containing polymer compound in the polishing composition is preferably 0.00001 to 1.0 mass %, more preferably 0.00005 to 0.5 mass %, still more preferably 0.0001 to 0.3 mass %, in terms of a solid content.

1-6. Copolymer Containing a Monomer Having a Carboxylic Acid Group and a Monomer Having a Sulfonic Acid Group as Essential Monomers The copolymer containing a monomer having a carboxylic acid group and a monomer having a sulfonic acid group as essential monomers will be described below. An example of the monomer having a carboxylic acid group includes an acrylic acid, a methacrylic acid, a maleic acid, an itaconic acid, the salts thereof or the like. An example of the monomer having a sulfonic acid group includes an isoprene sulfonic acid, a 2-acryl amide-2-methylpropane sulfonic acid, a 2-methacryl amide-2-methyl propane sulfonic acid, a styrene sulfonic acid, a vinyl sulfonic acid, an aryl sulfonic acid, a naphthalene sulfonic acid, the salts thereof, or the like.

A specific example of the copolymer containing a monomer having a carboxylic acid group and a monomer having a sulfonic acid group as essential monomers may include an acrylic acid/isoprene sulfonic acid copolymer, a methacrylic acid/isoprene sulfonic acid copolymer, an acrylic acid/2-acryl amide-2-methyl propane sulfonic acid copolymer, a methacrylic acid/2-acryl amide-2-methyl propane sulfonic acid copolymer, an acrylic acid/2-methacryl amide-2-methyl propane sulfonic acid copolymer, a methacrylic acid/2-methacryl amide-2-methyl propane sulfonic acid copolymer, or the like.

The proportions of the structural unit derived from the monomer having a carboxylic acid group and the structural unit derived from the monomer having a sulfonic acid group in the copolymer containing a monomer having a carboxylic acid group and a monomer having a sulfonic acid group as essential monomers are preferably in the range of 95:5 to 5:95, more preferably 90:10 to 10:90, still more preferably 80:20 to 20:80, by mole ratios, in the quantity ratio of the structural unit derived from the monomer having a carboxylic acid group and the structural unit derived from the monomer having a sulfonic acid group.

The copolymer containing a monomer having a carboxylic acid group and a monomer having a sulfonic acid group as essential monomers has a weight average molecular weight in the range of preferably 1,000 to 1,000,000, more preferably 3,000 to 500,000. Further, the weight average molecular weight of the copolymer is measured by gel permeation chromatography (GPC) in terms of polyacrylic acid.

The concentration of the copolymer containing a monomer having a carboxylic acid group and a monomer having a sulfonic acid group as essential monomers in the polishing composition is preferably 0.0001 to 2.0 mass %, more preferably 0.001 to 1.0 mass %, still more preferably 0.005 to 0.5 mass %, in terms of a solid content.

1-7. Copolymer Containing a Monomer Having a Carboxylic Acid Group and a Monomer Having an Amide Group as Essential Monomers According to at least one embodiment, the copolymer containing a monomer having a carboxylic acid group and a monomer having an amide group as essential monomers and used for the purpose of improving the polishing rate will be described below.

The structural unit derived from the monomer having a carboxylic acid group may be partially contained as a salt of carboxylic acid. The salt of carboxylic acid may include a sodium salt, a potassium salt, a magnesium salt, an ammonium salt, an amine salt, an alkyl ammonium salt and the like.

The structural unit derived from the monomer having a carboxylic acid group can be contained as a carboxylic acid, by performing polymerization as a monomer having a carboxylic acid group, or performing polymerization as a monomer having a carboxylic acid salt group and then performing cation exchange to be converted into a carboxylic acid. In addition, the structural unit derived from the monomer having a carboxylic acid group can be contained as a carboxylic acid salt, by performing polymerization as a monomer having a carboxylic acid salt group, or performing polymerization as a monomer having a carboxylic acid group and then performing neutralization with a base to form a carboxylic acid salt.

The proportion of the structural unit contained as a carboxylic acid, and the structural unit contained as a carboxylic acid salt can be evaluated, using a pH value of an aqueous copolymer solution. When the pH value of the aqueous copolymer solution is low, the content ratio of the structural unit contained as a carboxylic acid can be evaluated as high. Meanwhile, when the pH value of the aqueous copolymer solution is high, the content ratio of the structural unit contained as a carboxylic acid salt can be evaluated as high. In the present invention, for example, a copolymer having a pH value in the aqueous copolymer solution at a concentration of 10 mass % being 1 to 13 can be used.

It is preferred to use α, β-ethylenic unsaturated amide, as the monomer having an amide group. More specifically, α, β-ethylenic unsaturated carboxylic acid amide such as acryl amide, methacryl amide, N-alkyl acryl amide and N-alkyl methacryl amide may be included.

A specific example of N-alkyl acrylamide, N-alkyl methacrylamide and the like may include N-methyl acrylamide, N-ethyl acrylamide, N-n-propyl acrylamide, N-iso-propyl acrylamide, N-n-butyl acrylamide, N-iso-butyl acrylamide, N-sec-butyl acrylamide, N-tert-butyl acrylamide, N-methyl methacrylamide, N-ethyl methacrylamide, N-n-propyl methacrylamide, N-iso-propyl methacrylamide, N-n-butyl methacrylamide, N-iso-butyl methacrylamide, N-sec-butyl methacrylamide, N-tert-butyl methacrylamide and the like. Among them, N-n-butyl acrylamide, N-iso-butyl acrylamide, N-sec-butyl acrylamide, N-tert-butyl acrylamide, N-n-butyl methacrylamide, N-iso-butyl methacrylamide, N-sec-butyl methacrylamide and N-tert-butyl methacrylamide are particularly preferred.

It is preferred to prepare a copolymer, by combining and polymerizing the monomer components thereof. As the combination of the copolymers, a combination of acrylic acid and/or a salt thereof and N-alkyl acryl amide, a combination of acrylic acid and/or a salt thereof and N-alkyl methacrylamide, a combination of methacrylic acid and/or a salt thereof and N-alkyl acrylamide, and a combination of methacrylic acid and/or a salt thereof and N-alkyl methacryl amide are preferably used. Among them, those in which the alkyl group of N-alkyl acrylamide or N-alkyl methacrylamide is at least one selected from the group consisting of an n-butyl group, an iso-butyl group, a sec-butyl group and a tert-butyl group are particularly preferably used.

The proportions of the structural unit derived from the monomer having a carboxylic acid group and the structural unit derived from the monomer having an amide group in the copolymer containing a monomer having a carboxylic acid group and a monomer having an amide group as essential monomers are preferably in the range of 95:5 to 5:95, more preferably 90:10 to 10:90, by mole ratios, in the quantity ratio of the structural unit derived from the monomer having a carboxylic acid group and the structural unit derived from the monomer having an amide group.

The copolymer containing the structural unit derived from the monomer having a carboxylic acid group and the structural unit derived from the monomer having an amide group has a weight average molecular weight in the range of preferably 1,000 to 1,000,000, more preferably 3,000 to 500,000. Further, the weight average molecular weight of the copolymer is measured by gel permeation chromatography (GPC) in terms of polyacrylic acid.

The concentration of the copolymer containing a structural unit derived from the monomer having a carboxylic acid group and a structural unit derived from the monomer having an amide group in the polishing composition is preferably 0.0001 to 2.0 mass %, more preferably 0.001 to 1.0 mass %, still more preferably 0.005 to 0.5 mass %, in terms of a solid content.

1-8. Acids

The acid may include inorganic acids such as nitric acid, sulfuric acid, hydrochloric acid, phosphoric acid, phosphonic acid, phosphinic acid, pyrophosphoric acid, and tripolyphosphoric acid; organic phosphonic acids such as 2-aminoethylphosphonic acid, 1-hydroxyethyliden-1,1-diphosphonic acid, aminotri (methylenephosphonic acid), ethylene diamine tetra (methylenephosphonic acid), diethylene triamine (methylenephosphonic acid), ethane-1,1-diphosphonic acid, and methane hydroxyphosphonic acid; aminocarboxylic acids such as glutamic acid and aspartic acid; and carboxylic acids such as citric acid, tartaric acid, oxalic acid, nitroacetic acid, and maleic acid, and the like, specifically. The amount of the acid to be used can be appropriately determined according to the setting of the pH value of the polishing composition.

1-9. Oxidizing Agent

The oxidizing agent may include peroxide, permanganic acid or a salt thereof, chromic acid or a salt thereof, periodic acid or a salt thereof, and the like. A specific example thereof may include hydrogen peroxide, sodium peroxide, barium peroxide, potassium permanganate, orthoperiodic acid, sodium metaperiodate and the like. Among them, hydrogen peroxide is preferred. The oxidizing agent is used generally in a range of 0.1 to 10.0 mass %, as a content in the polishing composition.

The polishing composition according to at least one embodiment may include a buffer, fungicides, microbicides and the like, in addition to the above components.

1-10. Physical Properties

The polishing composition according to at least one embodiment preferably has a pH value (25° C.) of 0.1 to 4.0, more preferably 0.5 to 3.0. The pH values (25° C.) of the polishing composition equal to or above 0.1 make it possible to prevent the surface smoothness from worsening. The pH values (25° C.) of the polishing composition equal to or below 4.0 make it possible to prevent the polishing rate from decreasing. In electroless nickel-phosphorus plating, conditions with the pH values (25° C.) of not higher than 4.0 have a tendency for nickel to dissolve, and thus it is difficult that the plating takes place. In polishing, on the other hand, nickel has a tendency toward dissolution, for example, under conditions with the pH values (25° C.) of not higher than 4.0, and thus the use of the polishing composition of the present invention can result in an increase in the polishing rate.

2. Methods for Polishing Magnetic Disk Substrates

The polishing composition according to at least one embodiment is suitable for polishing magnetic disk substrates, such as an aluminum magnetic disk substrate which has been subjected to electroless nickel-phosphorus plating (hereinafter referred to as an aluminum disk), and a glass magnetic disk substrate. In particular, the polishing composition is suitable for use in polishing an aluminum disk.

Polishing methods in which the polishing composition according to at least one embodiment can be applied include, for example, a method (called polishing) in which a polishing pad is attached to a surface plate of a polishing machine, a polishing composition is fed onto a surface to be polished of a polishing object (for example, an aluminum disk) or onto the polishing pad, and the surface to be polished is rubbed with the polishing pad. For example, when the front- and back-side surfaces of an aluminum disk are polished at a time, a method is used in which use is made of a double side polishing machine provided with an upper surface plate and a lower surface plate to each of which a polishing pad has been attached. In this method, the front and back side surfaces of the aluminum disk are polished by feeding the polishing composition between the polishing pads attached to the upper surface plate and lower surface plate, and concurrently rotating these two polishing pads. For the polishing pad, use can be made of ones of polyurethane type, suede type, non-woven fabric type, and any other type.

EXAMPLES

Embodiments will be described below in a specific manner based on Examples which follow, but it goes without saying that these Examples are not intended to limit the present invention, which can be carried out in various embodiments, as long as they fall within the technical scope of the present invention.

(Method for Preparing Polishing Composition)

The polishing compositions used in Examples 1 to 30 and Comparative Examples 1 to 5 were ones including the following materials at the following contents. Further, the concentration of the total silica particles in all of the Examples and Comparative Examples was 4 mass %, and the pH of the polishing composition was 1.2. The results of performing polishing tests using these polishing compositions are shown in Tables 1 to 3.

(Colloidal Silica 1) (Average Primary Particle Size (D50): 50 nm, Commercially Available Colloidal Silica)

The proportion in the total silica particles is shown in Tables 1 to 3. It was used in Examples 1 to 7, 9 to 24 and 26 to 30, and Comparative Examples 1 to 5.

(Colloidal Silica 2) (Average Primary Particle Size (D50): 80 nm, Commercially Available Colloidal Silica)

The proportion in the total silica particles is shown in Tables 1 and 3. It was used in Example 8 and 25.

(Wet-Process Silica Particles 1) (Average Particle Size (D50): 300 nm, Commercially Available Wet-Process Silica Particles)

The proportion in the total silica particles is shown in Tables 1 to 3. It was used in Examples 1 to 8, 10 to 25 and 27 to 30, and Comparative Examples 1 to 5.

(Wet-Process Silica Particles 2) (Average Particle Size (D50): 400 nm, Commercially Available Wet-Process Silica Particles)

The proportion in the total silica particles is shown in Tables 1 and 3. It was used in Example 9 and 26.

(Fumed Silica) (Average Particle Size (D50): 270 nm, Commercially Available Fumed Silica)

The proportion in the total silica particles was 50 mass %, and it was used in Examples 18 to 30, and Comparative Examples 4 and 5.

(Sulfuric acid) The amount to be added was adjusted so that the pH of the polishing composition was 1.2. It was used in Examples 1 to 30, and Comparative Examples 1 to 5.

(Hydrogen peroxide) It was used at 0.9 mass %, in Examples 1 to 30, and Comparative Examples 1 to 5.

(Polydiallyl dimethyl ammonium chloride) (manufactured by DKS Co., Ltd., DC-902 P, weight average molecular weight=8000) The amount to be added is shown in Tables 1 to 3. It was used in Examples 1, 2, 5 to 10, 14, 15, 18, 19 and 22 to 27.

(Pentaethylenehexamine: abbreviated to PEHA) The amount to be added is shown in Tables 1 to 3. It was used in Example 3, 16 and 20.

(Lauryl dimethyl benzyl ammonium chloride) (manufactured by DKS Co., Ltd., CATIOGEN BC-50) The amount to be added is shown in Tables 1 to 3. It was used in Examples 4, 17 and 21.

(Acryl polymer 1) (sodium salt of copolymer of acrylic acid/2-acryl amide-2-methyl propane sulfonic acid=50/50 (mole ratio), weight average molecular weight=10000) The amount to be added is shown in Tables 1 and 3. It was used in Examples 6, 7, 11, 12, 23, 24, 28 and 29.

(Acryl polymer 2) (sodium salt of copolymer of acrylic acid/2-acryl amide-2-methyl propane sulfonic acid=90/10 (mole ratio), weight average molecular weight=10000) The amount to be added is shown in Tables 1 and 3. It was used in Examples 13 and 30.

(Acryl polymer 3) (copolymer of acrylic acid/N-tert-butyl acryl amide=90/10 (mole ratio), weight average molecular weight=10000) The amount to be added is shown in Tables 1 and 3. It was used in Examples 5, 7, 10, 12, 22, 24, 27 and 29.

(Acryl polymer 4) (sodium salt of homopolymer of acrylic acid, weight average molecular weight=10000) The amount to be added is shown in Tables 1 and 3. It was used in Comparative Examples 2 and 5.

Further, the weight average molecular weights of acryl polymers 1, 2, 3 and 4 were measured by gel permeation chromatography (GPC) in terms of polyacrylic acid, and the GPC measurement conditions were as follows:

(GPC Conditions)

Column: TSKgel G4000PWXL (manufactured by Tosoh Corporation)+G2500PWXL (manufactured by Tosoh Corporation)+SHODEX OHpak SB-806M-HQ (manufactured by Showa Denko K.K.)

Eluent: 0.2M phosphoric acid buffer/acetonitrile=9:1 (volume ratio)

Flow rate: 1.0 mL/min

Temperature: 40° C.

Detection: Differential refractive index (RI)

Sample: Concentration of 0.1 wt % (injected amount 100 µL)

Polymer for calibration curve: Polyacrylic acid molecular weight (Mp) 115000, 28000, 4100, 1250 (Sowa Science Co., Ltd., American Polymer Standards Corp.)

(Method for Measuring Particle Size of Silica Particles)

The particle diameter (Heywood diameter) of colloidal silica was determined as a Heywood diameter (projected area equivalent circular diameter) by taking photographs of fields of view at a magnification of ×100000 under a transmission electron microscope (TEM) (transmission electron microscope JEM 2000FX (200 kV), manufactured by JEOL Ltd.) and analyzing these photographs with an analysis software (Mac-View Ver. 4.0, manufactured by Mountech CO., Ltd.). The average primary particle size of colloidal silica is an average primary particle size (D50) when the particle diameters of about 2000 particles of colloidal silica were analyzed as described above and the particle size at which the cumulative particle size distribution (on a cumulative volume basis) from a smaller particle size reaches 50% is calculated using an above-mentioned analysis software (Mac-View Ver. 4.0, manufactured by Mountech CO., Ltd.).

The average particle size of wet-process silica particles was determined using a dynamic light scattering particle size distribution analyzer (Microtrac UPA, manufactured by NIKKISO CO., Ltd.) The average particle size of wet-process silica particles is an average particle size (D50) at which the cumulative particle size distribution on a volume basis from a smaller particle size reaches 50%.

The average particle size of the fumed silica was determined using a dynamic light scattering particle size distribution analyzer (Microtrac UPA, manufactured by NIKKISO CO., Ltd.). The average particle size of the fumed silica is an average particle size (D50) at which the cumulative particle size distribution on a volume basis from a smaller particle size side reaches 50%.

(Polishing Conditions)

Aluminum disks with an outer diameter of 95 mm that is plated with electroless nickel-phosphorus were used as a substrate to be polished, and polishing was performed under the following polishing conditions.

Polishing machine: 9B double-side polishing machine, manufactured by System Seiko Co., Ltd.

Polishing pad: P1 pads, manufactured by FILWEL Co., Ltd.

Surface plate rotating speed: upper surface plate: −9.0 min$^{-1}$

Lower surface plate: 12.0 min$^{-1}$

Feed of polishing composition: 90 ml/min

Polishing time: polishing was performed up to the time when the amount of polishing reached 1.2 to 1.5 μm per one side. (240 to 720 seconds)

Processing pressure: 120 kPa (Polishing Rate Ratio)

The polishing rate was calculated by measuring the decreased mass of a polished aluminum disk, according to the following formula:

$$\text{Polishing rate (μm/min)} = \text{decreased mass of a polished aluminum disk (g)/polishing time (min)/area of one side of the aluminum disk (cm}^2\text{)/density of electroless nickel-phosphorus plated film (g/cm}^3\text{)/} 2 \times 10^4$$

(Provided that, in the above formula, the area of one side of the aluminum disk was 65.9 cm$^2$ and the density of electroless nickel-phosphorus plated film was 8.0 g/cm$^3$.)

The polishing rate ratio is a relative value in a case where the polishing rate in Comparative Example 1 obtained by using the above formula is assumed to be 1 (reference). In Table 1, the polishing rate of Comparative Example 1 is set to 1, and the relative values thereto are shown for other experimental examples. In Table 2, the polishing rate of Comparative Example 3 is set to 1, and the relative values thereto are shown for other experimental examples. In Table 3, the polishing rate of Comparative Example 4 is set to 1, and the relative values thereto are shown for other experimental examples.

(Pits)

Pits were measured under a three-dimensional surface structure analyzing microscope utilizing a scanning white interference method, manufactured by Zygo Corp. The measurement was made using a measurement apparatus manufactured by Zygo Corp. (New View 8300 with a lens of an ×1.4 magnification and a zoom of 1.0 times) and a analysis software, manufactured by Zygo Corp. (Mx). The observed shape profiles were evaluated as "A (good)" for profiles having almost no pits. The observed shape profiles were evaluated as "B (acceptable)" for profiles having a few pits. The observed shape profiles were evaluated as "C (unacceptable)" for profiles having a number of pits. The evaluation of "C (unacceptable)" refers to the case that pits can be observed with the naked eye, but no C in this experiment.

Waviness (Zygo-Sa)

The waviness (Sa) of an aluminum disk was measured under a three-dimensional surface structure analyzing microscope utilizing a scanning white interference method, manufactured by Zygo Corp. (hereinafter, the waviness measured by this method is referred to as a "Zygo-Sa"). The measurement was made under the conditions of a measurement apparatus manufactured by Zygo Corp. (New View 8300 (lens: 1.4 times, zoom: 1.0 times) with a wavelength 100 to 500 μm and a measurement area of 6 mm×6 mm, and the analysis was performed using an analysis software (Mx), manufactured by Zygo Corp.

(Method for Evaluating Washability of Polishing Agent)

The polished aluminum disk in each of the Examples and Comparative Examples was rinsed with ion exchange water, buff washed using ion exchange water, further rinsed with ion exchange water after buff washing, and then dried by spin drying. The thus-obtained aluminum disk was used as a substrate for evaluating washability.

Further, this operation was carried out in a clean room.

The thus-obtained substrate for evaluating washability was evaluated by observing 6 fields of view on the front surface and 6 fields of view on the back surface (total 12 fields of view) for front and back surfaces of the aluminum disk, using MicroMAX VMX-4100 manufactured by Vision Psytech, Ltd. which is an apparatus for emphasizing and examining fine residual particles on the substrate surface, under the following measurement conditions, and counting the number of residual particles observed in one field of view (9 mm×7 mm). Further, the number of residual particles observed as described above was scored from the number of residual particles in total of 12 fields of view, by comparison with the following "washability evaluation criteria". The scores of washability evaluation are shown in Tables 1, 2 and 3.

MicroMAX VMX-4100 measurement conditions:

Tilt: −5°

Iris: 10

Zoom: 10

Washability Evaluation Criteria (The Number of Residual Particles in Total of 12 Fields of View):

AA: the number of residual particles 0 to 10

A: the number of residual particles 11 to 30

B: the number of residual particles 31 to 50

C: the number of residual particles >50

TABLE 1

| | Colloidal silica | | Wet-process silica particles | | Nitrogen-containing organic compound/polymer compound | | Copolymer containing a monomer having a carboxylic acid group and a monomer having a sulfonic acid group as essential monomers | | Copolymer containing a monomer having a carboxylic acid group and a monomer having an amide group as essential monomers | | Acrylic acid homopolymer | | | Polishing rate ratio (Comparative Example 1 = 1) | Pits | Waviness (Zygo-Sa) (Å) | Washability |
|---|---|---|---|---|---|---|---|---|---|---|---|---|---|---|---|---|---|
| | Average particle size D50 (nm) | Proportion in total silica (mass %) | Average particle size D50 (nm) | Proportion in total silica (mass %) | Type | Added amount (mass %) | Type | Added amount (mass %) | Type | Added amount (mass %) | Type | Added amount (mass %) | pH | | | | |
| Comparative Example 1 | 50 | 90 | 300 | 10 | — | — | — | — | — | — | — | — | 1.2 | 1.00 | A | 1.13 | C |
| Example 1 | 50 | 90 | 300 | 10 | DC902P | 0.0005 | — | — | — | — | — | — | 1.2 | 0.96 | A | 1.12 | A |
| Example 2 | 50 | 90 | 300 | 10 | DC902P | 0.002 | — | — | — | — | — | — | 1.2 | 0.92 | A | 1.14 | AA |
| Example 3 | 50 | 90 | 300 | 10 | PEHA | 0.0005 | — | — | — | — | — | — | 1.2 | 0.98 | A | 1.13 | A |
| Example 4 | 50 | 90 | 300 | 10 | BC50 | 0.0005 | — | — | — | — | — | — | 1.2 | 0.97 | A | 1.18 | B |
| Example 5 | 50 | 90 | 300 | 10 | DC902P | 0.0005 | — | — | — | — | — | — | 1.2 | 1.00 | A | 1.14 | AA |
| Example 6 | 50 | 90 | 300 | 10 | DC902P | 0.0005 | Acryl polymer 1 | 0.04 | — | — | — | — | 1.2 | 1.00 | A | 1.17 | AA |
| Example 7 | 50 | 90 | 300 | 10 | DC902P | 0.0005 | Acryl polymer 1 | 0.04 | — | — | — | — | 1.2 | 1.06 | A | 1.15 | AA |
| Example 8 | 50 | 90 | 300 | 10 | DC902P | 0.0005 | — | — | Acryl polymer 3 | 0.04 | — | — | 1.2 | 1.00 | A | 1.10 | A |
| Example 9 | 50 | 90 | 400 | 10 | DC902P | 0.0005 | — | — | Acryl polymer 3 | 0.04 | — | — | 1.2 | 1.20 | A | 1.61 | A |
| Example 10 | 50 | 90 | 300 | 10 | DC902P | 0.0005 | — | — | Acryl polymer 3 | 0.01 | — | — | 1.2 | 1.00 | A | 1.13 | A |
| Comparative Example 2 | 50 | 90 | 300 | 10 | — | — | — | — | — | — | Acryl polymer 4 | 0.04 | 1.2 | 1.00 | A | 1.12 | C |
| Example 11 | 50 | 90 | 300 | 10 | — | — | Acryl polymer 1 | 0.04 | — | — | — | — | 1.2 | 1.01 | A | 1.11 | A |
| Example 12 | 50 | 90 | 300 | 10 | — | — | Acryl polymer 1 | 0.04 | Acryl polymer 3 | 0.04 | — | — | 1.2 | 1.07 | A | 1.13 | A |
| Example 13 | 50 | 90 | 300 | 10 | — | — | Acryl polymer 2 | 0.04 | — | — | — | — | 1.2 | 1.02 | A | 1.12 | B |

TABLE 2

| | Colloidal silica | | Wet-process silica particles | | Nitrogen containg organic compound/polymer compound | | | Polishing rate ratio (Comparative Example 3 = 1) | | Waviness (Zygo-Sa) (Å) | Washability |
|---|---|---|---|---|---|---|---|---|---|---|---|
| | Average particle size D50 (nm) | Proportion in total silica (mass %) | Average particle size D50 (nm) | Proportion in total silica (mass %) | Type | Added amount (mass %) | pH | | Pits | | |
| Comparative Example 3 | 50 | 50 | 300 | 50 | — | — | 1.2 | 1.00 | A | 1.78 | C |
| Example 14 | 50 | 50 | 300 | 50 | DC902P | 0.0005 | 1.2 | 0.97 | A | 1.81 | A |
| Example 15 | 50 | 50 | 300 | 50 | DC902P | 0.002 | 1.2 | 0.93 | A | 1.75 | AA |
| Example 16 | 50 | 50 | 300 | 50 | PEHA | 0.0005 | 1.2 | 0.98 | A | 1.71 | A |
| Example 17 | 50 | 50 | 300 | 50 | BC50 | 0.0005 | 1.2 | 0.99 | A | 1.82 | B |

TABLE 3

| | Colloidal silica | | Fumed silica | | Wet-process silica particles | | Nitrogen-containing organic compound/polymer compound | | Copolymer containing a monomer having a carboxylic acid group and a monomer having a sulfonic acid group as essential monomers | | Copolymer containing a monomer having a carboxylic acid group and a monomer having a amide group as essential monomers | | Acrylic acid homopolymer | | | Polishing rate ratio (Comparative Example 4 = 1) | | | | |
|---|---|---|---|---|---|---|---|---|---|---|---|---|---|---|---|---|---|---|---|---|
| | Average particle size D50 (nm) | Proportion in total silica (mass %) | Average particle size D50 (nm) | Proportion in total silica (mass %) | Average particle size D50 (nm) | Proportion in total silica (mass %) | Type | Added amount (mass %) | Type | Added amount (mass %) | Type | Added amount (mass %) | Type | Added amount (mass %) | pH | | Pits | Waviness (Zygo-Sa) (Å) | Washability |
| Comparative Example 4 | 50 | 30 | 270 | 50 | 300 | 20 | — | — | — | — | — | — | — | — | 1.2 | 1.00 | A | 1.36 | C |
| Example 18 | 50 | 30 | 270 | 50 | 300 | 20 | DC902P | 0.0005 | — | — | — | — | — | — | 1.2 | 0.96 | A | 1.45 | A |
| Example 19 | 50 | 30 | 270 | 50 | 300 | 20 | DC902P | 0.002 | — | — | — | — | — | — | 1.2 | 0.92 | A | 1.51 | AA |
| Example 20 | 50 | 30 | 270 | 50 | 300 | 20 | PEHA | 0.0005 | — | — | — | — | — | — | 1.2 | 1.02 | A | 1.46 | A |
| Example 21 | 50 | 30 | 270 | 50 | 300 | 20 | BC50 | 0.0005 | — | — | — | — | — | — | 1.2 | 0.98 | A | 1.52 | B |
| Example 22 | 50 | 30 | 270 | 50 | 300 | 20 | DC902P | 0.0005 | — | — | Acryl polymer 3 | 0.04 | — | — | 1.2 | 1.00 | A | 1.50 | AA |
| Example 23 | 50 | 30 | 270 | 50 | 300 | 20 | DC900P | 0.0005 | Acryl polymer 1 | 0.04 | — | — | — | — | 1.2 | 1.00 | A | 1.44 | AA |
| Example 24 | 50 | 30 | 270 | 50 | 300 | 20 | DC902P | 0.0005 | Acryl polymer 1 | 0.04 | — | — | — | — | 1.2 | 1.05 | A | 1.46 | AA |
| Example 25 | 80 | 30 | 270 | 50 | 300 | 20 | DC902P | 0.0005 | — | — | Acryl polymer 3 | 0.01 | — | — | 1.2 | 1.00 | A | 1.54 | A |
| Example 26 | 50 | 30 | 270 | 50 | 400 | 20 | DC902P | 0.0005 | — | — | — | — | — | — | 1.2 | 1.21 | A | 1.89 | A |
| Example 27 | 50 | 30 | 270 | 50 | 300 | 20 | DC902P | 0.0005 | — | — | — | — | — | — | 1.2 | 1.00 | A | 1.52 | A |
| Comparative Example 5 | 50 | 30 | 270 | 50 | 300 | 20 | — | — | — | — | — | — | Acryl polymer 4 | 0.04 | 1.2 | 1.00 | A | 1.41 | C |
| Example 28 | 50 | 30 | 270 | 50 | 300 | 20 | — | — | Acryl polymer 1 | 0.04 | — | — | — | — | 1.2 | 1.01 | A | 1.39 | A |
| Example 29 | 50 | 30 | 270 | 50 | 300 | 20 | — | — | Acryl polymer 1 | 0.04 | Acryl polymer 3 | 0.04 | — | — | 1.2 | 1.07 | A | 1.40 | A |
| Example 30 | 50 | 30 | 270 | 50 | 300 | 20 | — | — | Acryl polymer 2 | 0.04 | — | — | — | — | 1.2 | 1.02 | A | 1.42 | B |

(Discussion)

Each of Examples 1 to 10, 14 to 17 and 18 to 27 show better washability than Comparative Example 1, 3 and 4 which do not include the nitrogen-containing organic compound polymer compound. Each of Examples 11 to 13 and 28 to 30 show better washability than Comparative Examples 1 and 4 which do not include the copolymer containing a monomer having a carboxylic acid group and a monomer having a sulfonic acid group as essential monomers. Examples 9 and 26 show higher waviness, but this is due to a larger particle size of the wet-process silica, and except for the influence of the particle size, the waviness of the Examples was not problematic. In addition, Comparative Examples 2 and 5 to which an acrylic acid homopolymer is added instead do not show a washability improvement effect.

Each of Examples 6, 7, 23 and 24 show better washability than Comparative Examples 1 and 4 which do not include the nitrogen-containing organic compound.polymer compound and the copolymer containing a monomer having a carboxylic acid group and a monomer having a sulfonic acid group as essential monomers. In addition, Examples 6, 7, 23 and 24 have results of better washability than Examples 1, 11, 12, 18, 28 and 29 which do not include any copolymer.

In addition to the above-described effects, Examples 5, 7, 10, 12, 22, 24, 27 and 29 are the experimental examples in which a copolymer containing a monomer having a carboxylic acid group and a monomer having an amide group as essential monomers is further added to the corresponding Examples, respectively, and have an improved polishing rate as compared with the corresponding Examples in any case.

INDUSTRIAL APPLICABILITY

The polishing composition according to various embodiments can be used for polishing electronic components such as semiconductors and magnetic recording media including hard disks. Particularly, the polishing composition can be used for polishing a surface of a substrate for a magnetic recording medium, such as a glass magnetic disk substrate and an aluminum magnetic disk substrate. Further, the polishing composition can be used for polishing a surface of an aluminum magnetic disk substrate for a magnetic recording medium, having an electroless nickel-phosphorus plated film formed on a surface of an aluminum alloy substrate.

What is claimed is:

1. A polishing composition for a magnetic disk substrate that is plated with electroless nickel-phosphorous, the polishing composition comprising:
    colloidal silica having an average primary particle size of 5 to 200 nm;
    pulverized wet-process silica particles having an average particle size of 100 to 1000 nm;
    at least one of a nitrogen-containing organic compound and a nitrogen-containing polymer compound;
    a copolymer containing a monomer having a carboxylic acid group and a monomer having an amide group as essential monomers; and
    water,
    wherein the nitrogen-containing organic compound is at least one of a polyalkylene polyamine and a quaternary ammonium salt,
    wherein the nitrogen-containing polymer compound is a cationic nitrogen-containing polymer compound, including a polymer or copolymer containing a monomer having a quaternary ammonium salt group as an essential monomer,
    wherein the colloidal silica accounts for 5 to 95 mass %, and the pulverized wet-process silica particles account for 5 to 95 mass %, of total silica particles,
    wherein a concentration of the total silica particles is 1 to 50 mass %, and
    wherein the monomer having an amide group is at least one selected from the group consisting of acryl amide, methacryl amide, N-alkyl acryl amide and N-alkyl methacryl amide.

2. A polishing composition for a magnetic disk substrate that is plated with electroless nickel-phosphorous, the polishing composition comprising:
    colloidal silica having an average primary particle size of 5 to 200 nm;
    pulverized wet-process silica particles having an average particle size of 100 to 1000 nm;
    a copolymer containing a monomer having a carboxylic acid group and a monomer having a sulfonic acid group as essential monomers;
    a copolymer containing a monomer having a carboxylic acid group and a monomer having an amide group as essential monomers; and
    water;
    wherein the colloidal silica accounts for 5 to 95 mass %, and the pulverized wet-process silica particles account for 5 to 95 mass %, of total silica particles,
    wherein a concentration of the total silica particles is 1 to 50 mass %, and
    wherein the monomer having an amide group is at least one selected from the group consisting of acryl amide, methacryl amide, N-alkyl acryl amide and N-alkyl methacryl amide.

3. A polishing composition for a magnetic disk substrate that is plated with electroless nickel-phosphorous, the polishing composition comprising:
    colloidal silica having an average primary particle size of 5 to 200 nm;
    pulverized wet-process silica particles having an average particle size of 100 to 1000 nm;
    at least one of a nitrogen-containing organic compound and a nitrogen-containing polymer compound; and
    a copolymer containing a monomer having a carboxylic acid group and a monomer having a sulfonic acid group as essential monomers;
    a copolymer containing a monomer having a carboxylic acid group and a monomer having an amide group as essential monomers; and
    water;
    wherein the colloidal silica accounts for 5 to 95 mass %, and the pulverized wet-process silica particles account for 5 to 95 mass %, of total silica particles,
    wherein a concentration of the total silica particles is 1 to 50 mass %, and
    wherein the monomer having an amide group is at least one selected from the group consisting of acryl amide, methacryl amide, N-alkyl acryl amide and N-alkyl methacryl amide.

4. The polishing composition for the magnetic disk substrate that is plated with electroless nickel-phosphorous according to claim 1, wherein the nitrogen-containing polymer compound has a weight average molecular weight of 500 to 1,000,000, and a concentration of 0.00001 to 1.0 mass % in the polishing composition.

5. The polishing composition for the magnetic disk substrate that is plated with electroless nickel-phosphorous according to claim 2, wherein the copolymer containing a monomer having a carboxylic acid group and a monomer having a sulfonic acid group as essential monomers is a copolymer having a quantity ratio of a structural unit derived from the monomer having a carboxylic acid group and a structural unit derived from the monomer having a sulfonic acid group being in a range of 95:5 to 5:95 by a mole ratio.

6. The polishing composition for the magnetic disk substrate that is plated with electroless nickel-phosphorous according to claim 1, wherein the copolymer containing a monomer having a carboxylic acid group and a monomer having an amide group as essential monomers is a copolymer having a quantity ratio of a structural unit derived from the monomer having a carboxylic acid group and a structural unit derived from the monomer having an amide group being in a range of 95:5 to 5:95 by a mole ratio.

7. The polishing composition for the magnetic disk substrate that is plated with electroless nickel-phosphorous according to claim 1, wherein the copolymer containing a monomer having a carboxylic acid group and a monomer having an amide group as essential monomers has a weight average molecular weight of 1,000 to 1,000,000, and a concentration of 0.0001 to 2.0 mass % in the polishing composition.

8. The polishing composition for the magnetic disk substrate that is plated with electroless nickel-phosphorous according to claim 1, further comprising an acid, wherein the polishing composition has a pH value (25° C.) in a range of 0.1 to 4.0.

9. The polishing composition for the magnetic disk substrate that is plated with electroless nickel-phosphorous according to claim 1, further comprising an oxidizing agent.

10. The polishing composition for the magnetic disk substrate that is plated with electroless nickel-phosphorous according to claim 3, wherein the nitrogen-containing organic compound is at least one of a polyalkylene polyamine and a quaternary ammonium salt.

11. The polishing composition for the magnetic disk substrate that is plated with electroless nickel-phosphorous according to claim 3, wherein the nitrogen-containing polymer compound is a cationic nitrogen-containing polymer compound, including a polymer or copolymer containing a monomer having a quaternary ammonium salt group as an essential monomer.

12. The polishing composition for the magnetic disk substrate that is plated with electroless nickel-phosphorous according to claim 11, wherein the nitrogen-containing polymer compound has a weight average molecular weight of 500 to 1,000,000, and a concentration of 0.00001 to 1.0 mass % in the polishing composition.

13. The polishing composition for the magnetic disk substrate that is plated with electroless nickel-phosphorous according to claim 3, wherein the copolymer containing a monomer having a carboxylic acid group and a monomer having a sulfonic acid group as essential monomers is a copolymer having a quantity ratio of a structural unit derived from the monomer having a carboxylic acid group and a structural unit derived from the monomer having a sulfonic acid group being in a range of 95:5 to 5:95 by a mole ratio.

* * * * *